United States Patent
Rajkomar et al.

[11] Patent Number: 5,909,037
[45] Date of Patent: Jun. 1, 1999

[54] BI-LEVEL INJECTION MOLDED LEADFRAME

[75] Inventors: Pradeep Rajkomar; William J. Beecher, both of San Jose, Calif.

[73] Assignee: Hewlett-Packard Company, Palo Alto, Calif.

[21] Appl. No.: 09/005,908

[22] Filed: Jan. 12, 1998

[51] Int. Cl.⁶ .................................................. H01L 33/00
[52] U.S. Cl. .................. 257/99; 257/88; 257/100
[58] Field of Search .................. 257/88, 98, 99, 257/100, 687, 666

[56] References Cited

U.S. PATENT DOCUMENTS

| | | | |
|---|---|---|---|
| 5,119,174 | 6/1992 | Chen | 257/98 |
| 5,177,593 | 1/1993 | Abe | 257/98 |
| 5,534,718 | 7/1996 | Chung | 257/98 |
| 5,660,461 | 8/1997 | Ignatius et al. | 257/668 |

FOREIGN PATENT DOCUMENTS

| | | | |
|---|---|---|---|
| 4-307975 | 10/1992 | Japan | 257/99 |
| 6-232457 | 8/1994 | Japan | 257/100 |

Primary Examiner—Olik Chaudhuri
Assistant Examiner—Mat Kelley
Attorney, Agent, or Firm—Pamela Lau Kee

[57] ABSTRACT

A x-y array of light emitting diodes has insert molded leadframes to minimize manufacturing costs during assembly.

2 Claims, 2 Drawing Sheets

BI-LEVEL INJECTION MOLDED LEADFRAME

FIELD OF THE INVENTION

The invention is directed towards the field of light emitting diode assembly, particularly, a multi-device package.

BACKGROUND AND SUMMARY OF THE INVENTION

Conventionally, tiled light-emitting diodes (LEDs) are mounted on a printed circuit board (PCB). The PCB is often a multi-layer substrate with pins inserted. After bonding with gold or aluminum sire, the PCB is usually encapsulated with epoxy in a plastic housing. There are a large number of piece parts and sub-operations that contribute to the high cost of tiles through material and assembly costs.

Simplifying the number of piece parts and assembly processes needed to build a tiled LED frame would result in a high level of automation and mechanization. In addition, there would be a marked decrease in overall manufacturing costs.

In the present invention, a package for light-emitting diodes is made of injection molded material to minimize manufacturing costs during assembly. The package includes an M×N array of cavities, e.g. 4×4. Each cavity has an upper ring and a base. A first metal contact, e.g. anode, is attached to the upper ring. A second metal contact, e.g. cathode, is attached to the base. For each contact, leads extend beyond the housing. The first and second metal contacts are electrically isolated from each other. The metal contacts may be copper-based and coated with silver or palladium. A die, e.g. a light-emitting diode (LED), is electrically connected to the base. Wire bonds extend from the die to the first metal contact. Silicone fills the remaining cavity. Diffusant tape is used to seal the cavity.

DETAILED DESCRIPTION OF THE DRAWINGS

Figure 1:
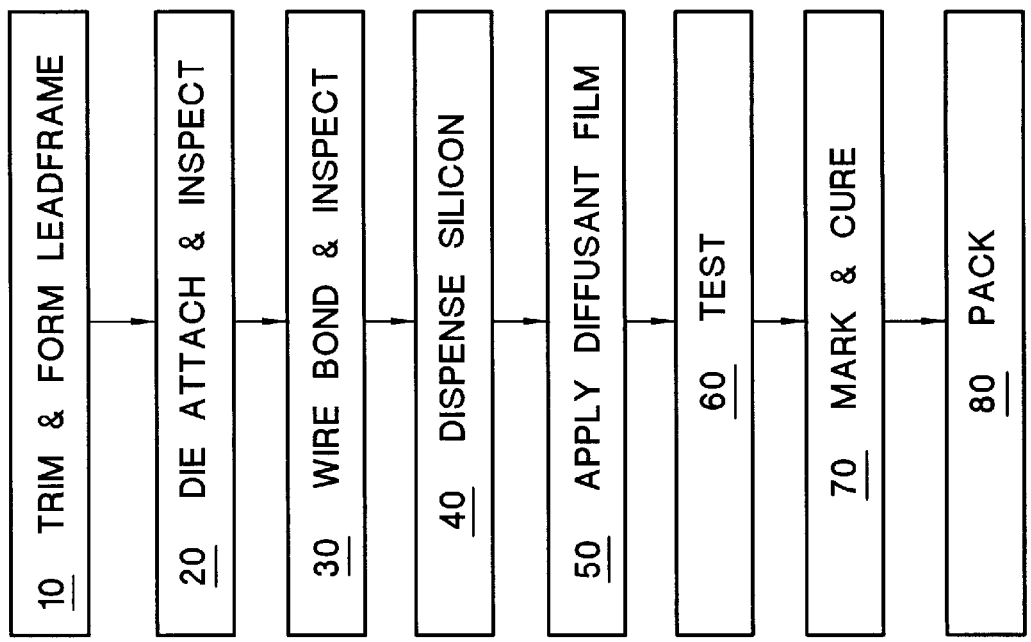
FIG. 1 is a process flow chart for the present invention.

FIG. 1 illustrates a process diagram depicting a preferred flow chart for the present invention. In step 10, the leadframe is trimmed and formed. In step 20, the die is attached and the attachment is inspected. In step 30, wires are bonded to the die and the bonds are inspected. In step 40, silicone is inserted into the assembly. In step 50, a diffusant film is applied across the cavity opening. In step 60, the assembly is tested. In step 70, the assembly is marked and cured. In step 80, the assembly is packaged.

Figure 2A:
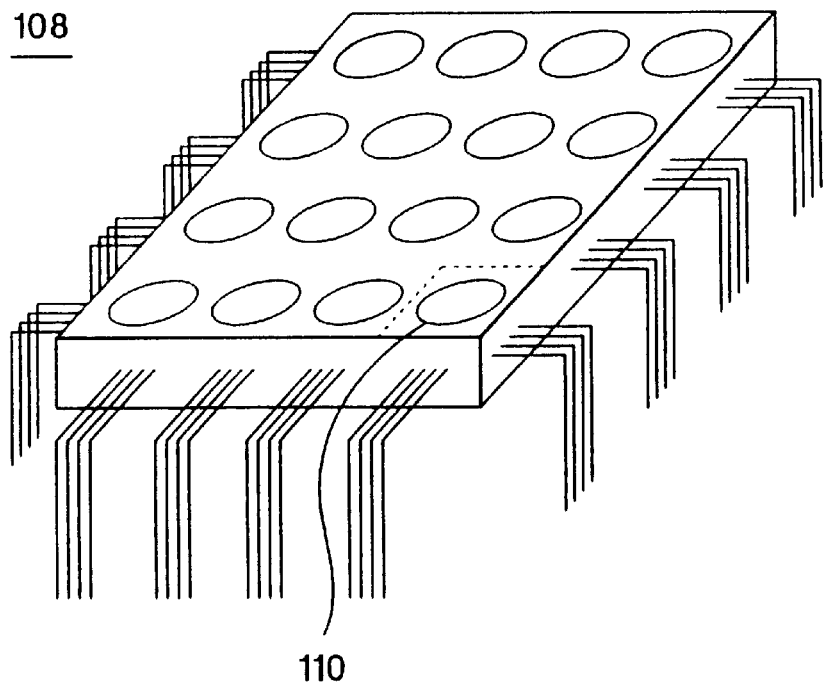
FIGS. 2A and 2B shows a preferred embodiment of the present invention.
Figure 2B:
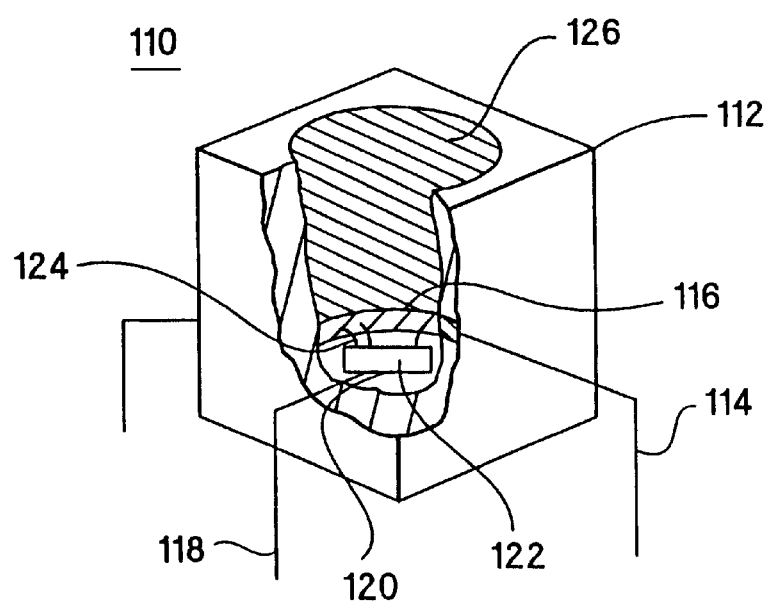

FIGS. 2A and 2B show a preferred embodiment of the present invention. In FIG. 2A, an injection molded leadframe 108 includes an M×N array of cavities, e.g. 4×4. FIG. 2B is a cross-sectional view of one of the cavities 110. Each cavity 110 has an upper ring and a base. A first metal contact 114 is attached to the upper ring. A second metal contact 120 is attached to the base. Each metal contact 114, 120 has leads that extend beyond the housing. The first and second metal contacts 114, 120 are electrically isolated from each other. The metal contacts may be copper-based and coated with silver or palladium. A die 122, e.g. a vertical cavity surface-emitting laser (VCSEL), is electrically connected to the base. Wire bonds 124 extend from the die 122 to the first metal contact 114. Silicone (not shown) fills the remaining cavity. Diffusant tape (not shown) is used to seal the cavity.

Each row or column of first metal contacts may be electrically connected. In this embodiment, it is preferable that the array of first metal contacts be electrically connected to form a ground plane in the leadframe.

Each cavity may include an optional reflective surface 126 along the interior to promote light emission.

We claim:

1. A leadframe comprising:
   a housing of dielectric material, having a cavity that has an upper ring and a base;
   a first metal contact, abutting the base, having leads that extend beyond the housing;
   a second metal contact, abutting the base, having leads that extend beyond the housing;
   wherein the first and second metal contacts are electrically isolated from each other
   a light emitting diode, electrically connected to the second metal contact;
   wire bond, connecting from the light emitting diode to the first metal contact;
   silicone within the cavity of the housing; and
   a diffusant tape across the top of the housing.

2. A multiple die leadframe comprising:
   a housing of dielectric material having M×N cavities, where M and are integers ≧1, wherein each cavity has an upper ring and a base;
   for each cavity
      a first metal contact abutting the upper ring, having leads that extend beyond the housing,
      a second metal contact abutting the base, having leads that extend beyond the housing,
      a light emitting diode, electrically connected to the second metal contact,
      wire bonds, connecting from the light emitting diode to the first metal contact
      silicone within the cavity of the housing,
   a diffusant tape across the top of the housing;
   wherein the first and second metal contacts are electrically isolated from each other; and
   wherein the first metal contacts for each of the cavities in the M direction are electrically connected to each other.

* * * * *